US011425792B2

(12) United States Patent
Sugimoto

(10) Patent No.: US 11,425,792 B2
(45) Date of Patent: Aug. 23, 2022

(54) VEHICLE WARM-UP CONTROL APPARATUS

(71) Applicant: TOYOTA JIDOSHA KABUSHIKI KAISHA, Toyota (JP)

(72) Inventor: Kazuhiro Sugimoto, Ashigarakami-gun (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 497 days.

(21) Appl. No.: 16/690,329

(22) Filed: Nov. 21, 2019

(65) Prior Publication Data

US 2020/0214088 A1 Jul. 2, 2020

(30) Foreign Application Priority Data

Dec. 26, 2018 (JP) ............................ JP2018-243145

(51) Int. Cl.
*H05B 1/02* (2006.01)
*H03K 17/0412* (2006.01)
*B60H 1/22* (2006.01)

(52) U.S. Cl.
CPC ......... *H05B 1/0236* (2013.01); *B60H 1/2218* (2013.01); *B60H 1/2221* (2013.01); *H03K 17/04126* (2013.01); *H05B 1/0202* (2013.01)

(58) Field of Classification Search
CPC .. H05B 1/0236; H05B 1/0202; B60H 1/2218; B60H 1/2221; B60H 1/0034; B60H 1/143; H03K 17/04126; H03K 17/0406; H03K 17/0412; H03K 2217/0081; Y02T 10/70; Y02T 10/7072; Y02T 90/14; B60L 58/28; B60L 2210/42
See application file for complete search history.

(56) References Cited

U.S. PATENT DOCUMENTS

2009/0277701 A1* 11/2009 Soma ...................... B60L 53/22 701/99
2021/0016765 A1* 1/2021 Toda ........................ B60L 9/18

FOREIGN PATENT DOCUMENTS

JP 2006-131016 A 5/2006
JP 2011-147205 A 7/2011

* cited by examiner

*Primary Examiner* — Shawntina T Fuqua
(74) *Attorney, Agent, or Firm* — Oliff PLC

(57) ABSTRACT

A vehicle warm-up control apparatus includes: a motor; an inverter; an electric storage device; a boost converter connected to a low-voltage-side power line and a high-voltage-side power liner; and a control unit for controlling the inverter and the boost converter, the boost converter including a first switching device as an upper arm, a second switching device as a lower arm, and a reactor. Further, the second switching device is composed of a semiconductor device variable in resistance value, and when warm-up is requested, the control unit executes warm-up control to set the resistance value of the second switching device higher than the resistance value during operation when the warm-up is not requested, and supply heat generated in the second switching device by passing current through the second switching device to a device for which the warm-up is requested.

5 Claims, 4 Drawing Sheets

VEHICLE WARM-UP CONTROL APPARATUS

CROSS-REFERENCE TO RELATED APPLICATION(S)

The present application claims priority to and incorporates by reference the entire contents of Japanese Patent Application No. 2018-243145 filed in Japan on Dec. 26, 2018.

BACKGROUND

The present disclosure relates to a vehicle warm-up control apparatus.

Japanese Laid-open Patent publication No. 2011-147205 discloses a control apparatus capable of preventing iron loss in a reactor by controlling on/off time in intermittent switching control of a converter even when it increases the switching frequency to increase switching loss.

SUMMARY

There is a need for providing a vehicle warm-up control apparatus capable of performing warm-up using waste heat of a converter regardless of whether the vehicle is running or stopped.

According to and embodiment, a vehicle warm-up control apparatus includes: a motor for travelling; an inverter for driving the motor; an electric storage device; a boost converter connected to a low-voltage-side power line, to which the electric storage device is connected, and a high-voltage-side power line, to which the inverter is connected, the boost converter being capable of a boosting operation to boost power of the low-voltage-side power line and supply the power to the high-voltage-side power line; and a control unit for controlling the inverter and the boost converter. Further, the boost converter includes a first switching device as an upper arm connected to a positive electrode bus of the high-voltage-side power line, a second switching device as a lower arm connected to the first switching device and a negative electrode bus of the high-voltage-side power line, and a reactor connected to a connection point between the first switching device and the second switching device and a positive electrode bus of the low-voltage-side power line, the second switching device is composed of a semiconductor device variable in resistance value, and when warm-up is requested, the control unit executes warm-up control to set the resistance value of the second switching device higher than the resistance value during operation when the warm-up is not requested, and supply heat generated in the second switching device by passing current through the second switching device to a device for which the warm-up is requested.

DETAILED DESCRIPTION

In a configuration described in Japanese Laid-open Patent publication No. 2011-147205, a switching device of an upper arm is switched on and off to increase the switching loss of the converter, so that current flows from the upper arm of the converter to the motor via an inverter. That is, the motor is driven during the intermittent switching control. Therefore, with the configuration described in Japanese Laid-open Patent publication No. 2011-147205, warm-up control is possible in an environment where the motor is driven, but it is difficult to perform warm-up control while the vehicle is stopped.

Hereinafter, a vehicle warm-up control apparatus in an embodiment of the present disclosure will be described in detail with reference to the accompanied drawings. Note that the present disclosure is not limited to the embodiment described below.

Figure 1:
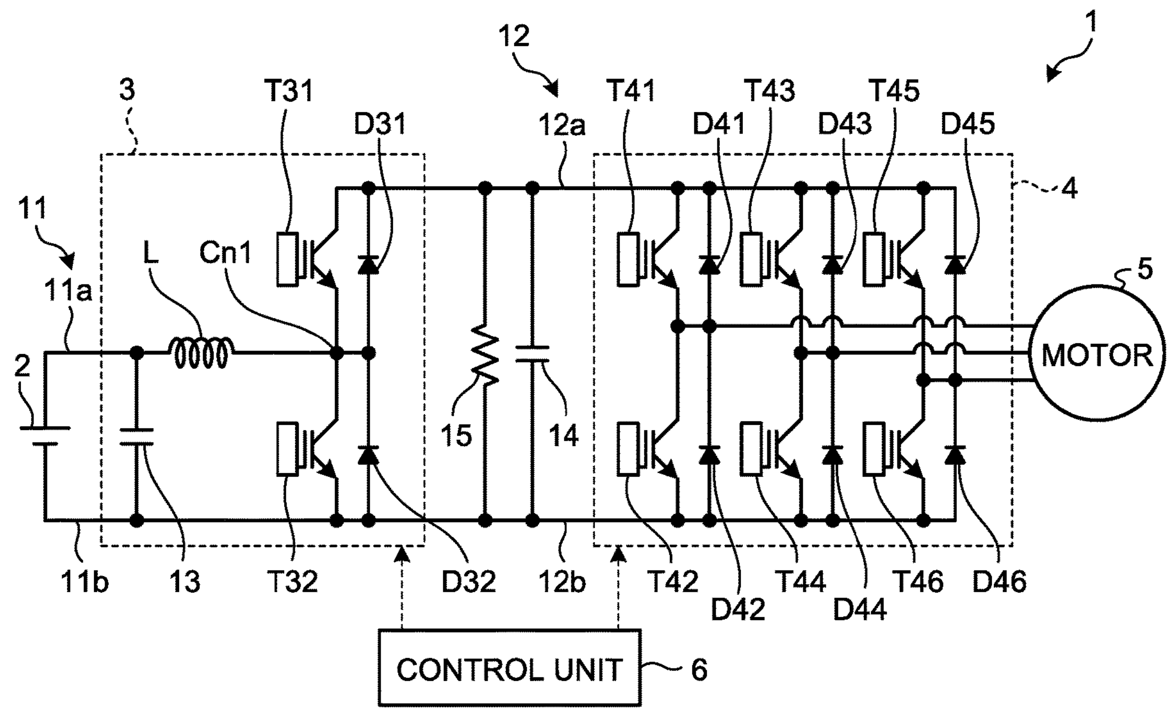
FIG. 1 is a diagram schematically illustrating a general configuration of a system mounted on a vehicle.

FIG. 1 is a diagram schematically illustrating a general configuration of a system mounted on a vehicle. As illustrated in FIG. 1, a system 1 includes a battery 2, a boost converter 3, an inverter 4, a motor 5, and a control unit 6. In this system 1, DC power output from the battery 2 can be boosted by the boost converter 3 and supplied to the inverter 4. Then, the DC power input from the boost converter 3 to the inverter 4 is converted into AC power by the inverter 4, and the AC power is supplied from the inverter 4 to the motor 5. The motor 5 is driven by the AC power. The control unit 6 is composed of an electronic control unit (ECU) that controls the boost converter 3, the inverter 4, and the motor 5. The drive of the motor 5 is controlled by command signals output from the control unit 6 to the boost converter 3 and the inverter 4. Further, when warm-up of a component in the vehicle equipped with the system 1 is requested, the control unit 6 executes control to supply heat to the component for which warm-up is requested using waste heat of the boost converter 3 (warm-up control). The warm-up control apparatus of the first embodiment includes at least the control unit 6 and the boost converter 3.

The battery 2 is an electric storage device composed of a secondary battery, and is connected to a low-voltage-side power line 11. A positive electrode bus 11*a* of the low-voltage-side power line 11 is connected to the positive electrode of the battery 2. A negative electrode bus 11*b* of the low-voltage-side power line 11 is connected to the negative electrode of the battery 2.

The boost converter 3 is connected to a high-voltage-side power line 12 to which the inverter 4 is connected, and to the low-voltage-side power line 11 to which the battery 2 is connected. The boost converter 3 includes two switching devices T31 and T32, two diodes D31 and D32, and a reactor L.

The first switching device T31 is connected to a positive electrode bus 12*a* of the high-voltage-side power line 12. The second switching device T32 is connected to the first switching device T31, and a negative electrode bus 12*b* of the high-voltage-side power line 12 and the negative electrode bus 11*b* of the low-voltage-side power line 11. In the boost converter 3, the first switching device T31 as an upper arm and the second switching device T32 as a lower arm are connected in series. The switching devices T31 and T32 are composed of insulated-gate bipolar transistors (IGBTs). The two diodes D31 and D32 are connected in parallel with the switching devices T31 and T32 in the reverse direction, respectively. The reactor L is connected to a connection point Cn1 between the first switching device T31 and the second switching device T32, and the positive electrode bus 11*a* of the low-voltage-side power line 11.

The boost converter 3 can boost the power of the low-voltage-side power line 11 and supply it to the high-voltage-side power line 12 by the control unit 6 adjusting the on-time ratio between the switching devices T31 and T32. A smoothing capacitor 13 is connected to the positive electrode bus 11*a* and the negative electrode bus 11*b* of the low-voltage-side power line 11.

The inverter 4 is composed of an inverter circuit including six switching devices T41 to T46 and six diodes D41 to D46 so as to be able to pass three-phase current through coils. The inverter circuit is a power conversion circuit that converts DC power into AC power by the switching operation of the switching devices T41 to T46 on a phase-by-phase basis (U phase, V phase, and W phase).

As illustrated in FIG. 1, the inverter 4 is connected to the high-voltage-side power line 12 and the motor 5. The switching devices T41 to T46 are arranged in series in pairs to constitute upper arms and lower arms of the phases (U phase, V phase, and W phase) with respect to the positive electrode bus 12*a* and the negative electrode bus 12*b* of the high-voltage-side power line 12. The switching devices T41 to T46 are composed of insulated-gate bipolar transistors (IGBTs). The six diodes D41 to D46 are connected in parallel with the switching devices T41 to T46 in the reverse direction, respectively. The three-phase coils (U-phase, V-phase, and W-phase) of the motor 5 are connected to connection points of the pairs of switching devices of the switching devices T41 to T46. When voltage is applied to the inverter 4, the on-time ratio of the switching devices T41 to T46 forming the pairs is adjusted by the control unit 6, whereby a rotating magnetic field is formed at the three-phase coils, rotationally driving the motor 5. A smoothing capacitor 14 and a discharging resistor 15 are connected to the positive electrode bus 12*a* and the negative electrode bus 12*b* of the high-voltage-side power line 12.

The motor 5 is a traveling motor serving as a power source of the vehicle. The motor 5 is electrically connected to the battery 2 via the inverter 4 and the boost converter 3, and is driven by power supplied from the battery 2. The motor 5 and the inverter 4 are electrically connected via the three-phase coils (U-phase, V-phase, and W-phase). The motor 5 is driven by current flowing through the three-phase coils. The motor 5 serves not only as an electric motor but also as a generator. The vehicle described here is an electric vehicle using the motor 5 as a power source.

The control unit 6 is composed of an electronic control unit (ECU) that controls the drive of the motor 5. The control unit 6 includes a CPU, a storage unit in which data such as various programs are stored, and an arithmetic processing unit that performs various operations for controlling the drive of the motor 5. To the control unit 6, signals from various sensors (not illustrated) are input. Signals input to the control unit 6 include a resolver signal from a motor rpm sensor that detects the rpm of the motor 5, a battery temperature from a temperature sensor that detects the temperature of the battery 2, a current value from a current sensor that detects current flowing through the upper arm of the boost converter 3, and a current value from a current sensor that detects current flowing through the lower arm of the boost converter 3 (none of them are illustrated). For example, when a resolver signal from the motor rpm sensor is input to the control unit 6, the arithmetic processing unit performs arithmetic processing for motor control, such as calculating the rpm of the motor 5 based on the resolver signal. As a result of calculation in the arithmetic processing unit, a command signal for controlling the boost converter 3 and the inverter 4 is output from the control unit 6 to the boost converter 3 and the inverter 4. The command signal includes a switching control signal to the switching devices T31 and T32 of the boost converter 3, and a switching control signal to the switching devices T41 to T46 of the inverter 4. Thus, the control unit 6 controls the boost converter 3 and the inverter 4, thereby controlling voltage and current applied to the motor 5.

When warm-up is requested, the control unit 6 executes warm-up control to supply heat to a component for which warm-up is requested, using waste heat of the boost converter 3. The requested warm-up includes the warm-up of the battery 2 and the heating of the vehicle interior. When executing the warm-up control, the control unit 6 changes the resistance value of the second switching device T32 constituting the lower arm of the boost converter 3, to pass current through the second switching device T32 to generate heat in the second switching device T32. That is, the control unit 6 controls the resistance value of the second switching device T32 to increase loss in the lower arm in the boost converter 3 when passing current. Then, the control unit 6 supplies heat generated in the second switching device T32 to the device for which warm-up is requested. For example, the heat generated in the second switching device T32 is transferred to cooling water for cooling the second switching device T32. In this case, the heat of the switching device T32 is supplied to the device for which warm-up is requested via the cooling water. Thus, the control unit 6 executes waste heat increase control utilizing the lower arm of the boost converter 3 as the warm-up control executed when warm-up is requested. When executing the warm-up control using the second switching device T32 of the boost converter 3 as a heat generation unit, the control unit 6 outputs only a switching control signal to the second switching device T32 of the boost converter 3 as a command signal for the warm-up control. In this description, the waste heat increase control is sometimes described as lower arm ON control.

For example, when heating is requested (warm-up is requested) for heating the vehicle interior by an air conditioner (not illustrated) under very low temperature while the vehicle is stopped, the control unit 6 supplies heat generated by loss in the boost converter 3 to a heater core constituting the device for which warm-up is requested. The heater core temperature is input to the control unit 6 as a signal from a temperature sensor (not illustrated) that detects the temperature of the heater core. Under very low temperature means under an environment where the outside temperature of the vehicle is minus some tens of degrees, for example.

Figure 2:
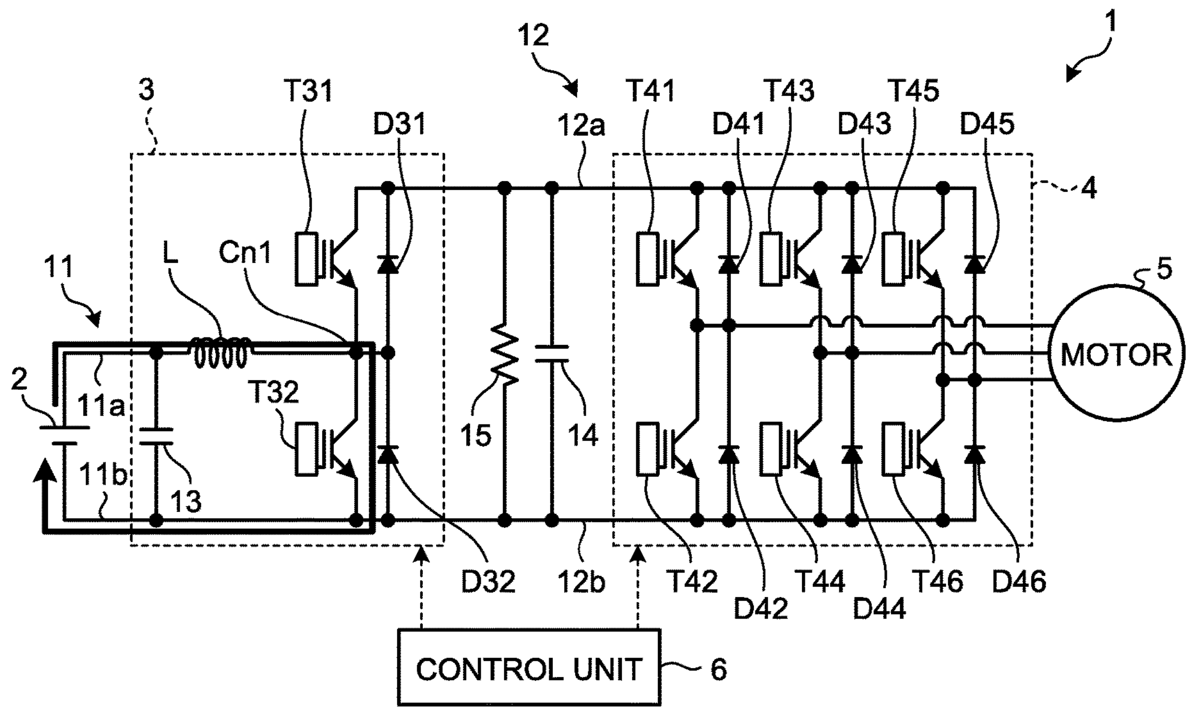
FIG. 2 is a diagram illustrating a state in which heat is generated in a lower arm of a boost converter when warm-up is requested while the vehicle is stopped.

FIG. 2 is a diagram illustrating a state in which heat is generated in the lower arm of the boost converter 3 when warm-up is requested while the vehicle is stopped. As illustrated in FIG. 2, when warm-up is requested while the vehicle is stopped, the control unit 6 executes the lower arm ON control to pass current only through the lower arm of the boost converter 3. In this case, no current flows through the upper arm of the boost converter 3. This results in an energization state in which only the second switching device T32 and the reactor L are heated. At this time, the control unit 6 controls the resistance of the second switching device T32 to make it larger. When warm-up is requested, the resistance value of the second switching device T32 is set to a value larger than the resistance value during operation when warm-up is not requested, that is, the resistance value during normal boosting operation. Consequently, current flows from the positive electrode of the battery 2 to the second switching device T32 of the lower arm via the reactor L. The current flowing out of the lower arm of the boost converter 3 flows to the negative electrode of battery 2 via the negative electrode bus 11*b* of the low-voltage-side power line 11. Thus, no current flows through the upper arm of the boost converter 3, so that the motor 5 does not work. Therefore, warm-up is possible while the vehicle is stopped. In this description, the warm-up control executed while the vehicle is stopped is sometimes referred to as first warm-up control.

When changing the resistance of the second switching device T32 at the time of the lower arm ON control, the control unit 6 executes control to change the resistance of the second switching device T32 stepwise with an active gate (active gate control). In the active gate control, the resistance value of a discharge path connected to the gate of the second switching device T32 is switched from low to high. Alternatively, when changing the resistance of the second switching device T32, the control unit 6 executes control to bring the second switching device T32 into a half-ON state (half-ON control). The half-ON state represents an intermediate state between the ON state and the OFF state of the second switching device T32. When the second switching device T32 is brought into the half-ON state, the resistance value of the second switching device T32 becomes larger than that in the normal ON state (during normal boosting operation).

Figure 3:
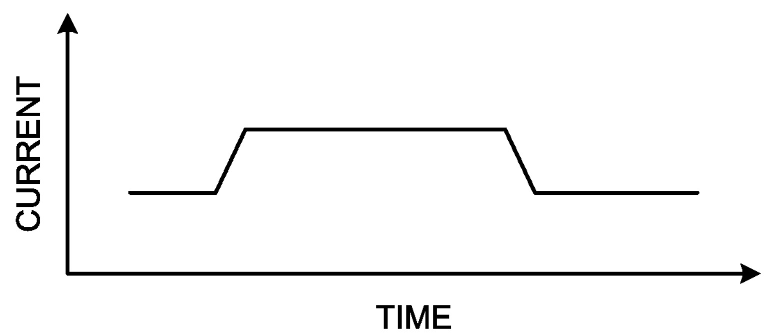
FIG. 3 is a graph illustrating an example in a case where current is passed through a second switching device of the lower arm with resistance increased at the time of warm-up control.

FIG. 3 is a graph illustrating an example in a case where current is passed through the second switching device T32 of the lower arm with the resistance increased at the time of the warm-up control. As illustrated in FIG. 3, at the time of the warm-up control, current starts to flow gradually through the second switching device T32 set to a large resistance value, and brings it into a constant energized state at a predetermined value. Then, the energized state of the second switching device T32 is controlled such that the current gradually decreases from the constant energized state.

Figure 4:
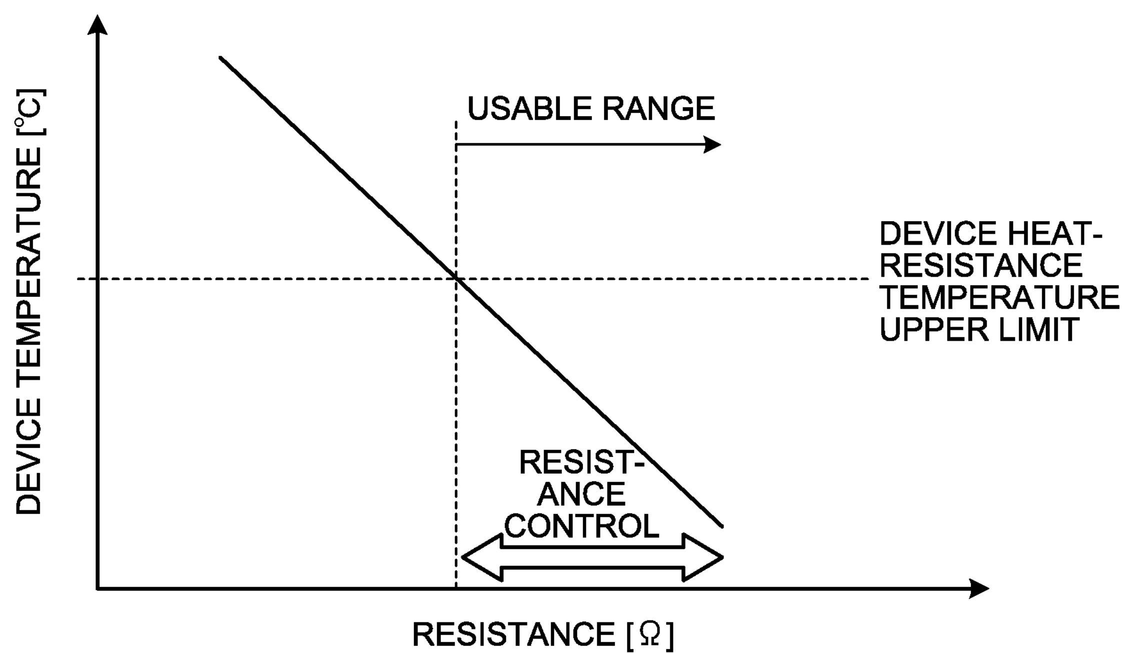
FIG. 4 is a graph illustrating a relationship between a resistance of the second switching device and a device temperature.

FIG. 4 is a graph illustrating the relationship between the resistance of the second switching device T32 and the device temperature. As illustrated in FIG. 4, the second switching device T32 has a characteristic that the device temperature gradually decreases as the resistance increases. The second switching device T32 is controlled by the control unit 6 to operate with the device temperature being lower than the upper limit of the device heat-resistance temperature. During the warm-up control, the control unit 6 controls the second switching device T32 to resistance values at which the device temperature is lower than the device heat-resistance temperature upper limit, as a usable range of resistance values of the second switching device T32.

Further, the control unit 6 can execute the waste heat increase control in the boost converter 3 not only when the vehicle is stopped but also when warm-up is requested during traveling. During traveling, the motor 5 outputs power necessary for the vehicle to travel. Thus, the control unit 6 performs control such that current flows also through the lower arm of the boost converter 3 while maintaining an energized state in which drive current (motor current) necessary for the motor 5 to power flows through the motor 5. Also in this case, the control unit 6 controls the resistance of the second switching device of the lower arm.

Figure 5:
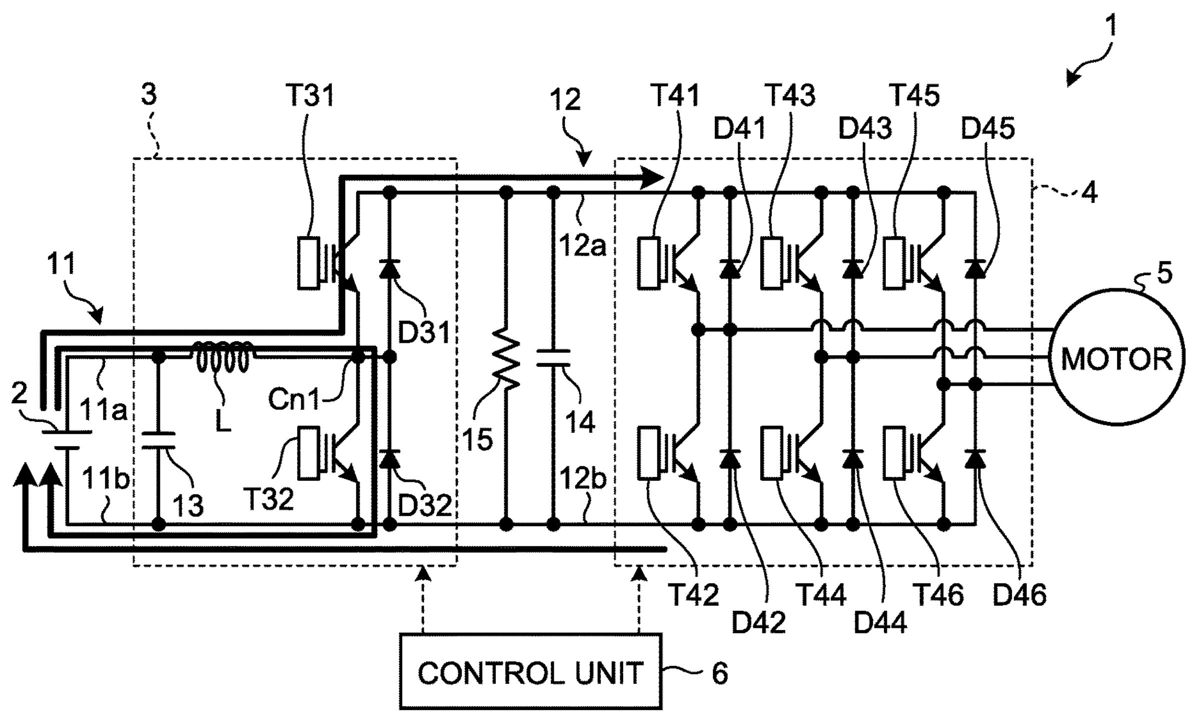
FIG. 5 is a diagram illustrating a state in which heat is generated in the lower arm of the boost converter when warm-up is requested during traveling.

FIG. 5 is a diagram illustrating a state in which heat is generated in the lower arm of the boost converter 3 when warm-up is requested during traveling. During traveling, the first switching device T31 of the boost converter 3 is turned on, and current flows from the battery 2 through the upper arm of the boost converter 3, thus resulting in an energized state in which drive current necessary for the vehicle to travel flows through the inverter 4 and the motor 5. By the control of the control unit 6, the drive current flows through the inverter 4 and conductors of the phases of the motor 5 (U-phase, V-phase, and W-phase). Further, when warm-up is requested during traveling, the control unit 6 also executes the lower arm ON control to pass current through the lower arm of the boost converter 3. In this case, the control unit 6 executes warm-up control to pass current through the second switching device T32 to generate heat necessary for the warm-up requested, with the resistance value of the second switching device T32 of the boost converter 3 increased. The resistance value of the second switching device T32 set at the time of the lower arm ON control during traveling is set to a value larger than the resistance value during operation when warm-up is not requested, that is, the resistance value during normal boosting operation. Consequently, also during traveling, heat is generated in the second switching device T32 while the driven state of the motor 5 is ensured, so that waste heat from the second switching device T32 to the cooling water can be increased. Further, even when warm-up is requested, the control unit 6 can set the resistance value of the second switching device T32 to different values between when the vehicle is traveling and when the vehicle is stopped. Note that, in this description, the warm-up control executed during traveling is sometimes referred to as second warm-up control.

Figure 6:
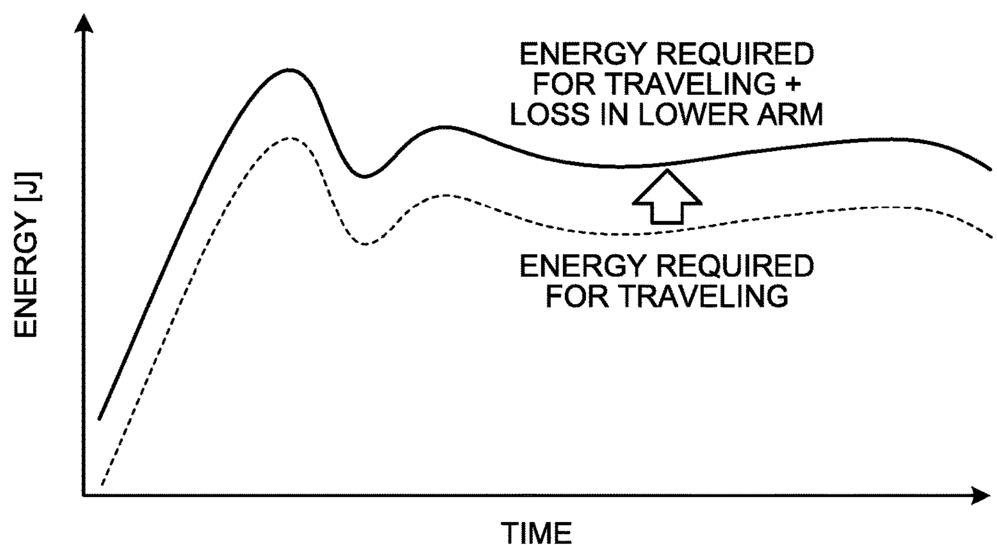
FIG. 6 is a graph illustrating energy required for traveling.

FIG. 6 is a graph illustrating energy required for traveling. As indicated by a broken line in FIG. 6, when the electric vehicle travels, the output from the battery satisfies the energy necessary for the electric vehicle to travel (required driving force). When warm-up is requested during traveling, energy sufficient to compensate for loss in the lower arm of the boost converter 3 is taken out of the battery 2 while the energy required for traveling is secured. That is, when the waste heat increase control is executed in the boost converter 3 during traveling, the energy increases by the amount of loss generated in the lower arm of the boost converter 3 for the warm-up requested, in addition to the energy required for traveling. Here, in order to pass drive current required for traveling through the motor 5, it is necessary to prevent current flowing through the lower arm of the boost converter 3 from becoming too large. That is, it is important to control by the control unit 6 the resistance value of the second switching device T32 to make it a large value. If the resistance value of the second switching device T32 in the lower arm is lowered too much, overcurrent flows through the lower arm of the boost converter 3. Current flowing through the upper arm of the boost converter 3 becomes insufficient, and the drive current of the motor 5 decreases. This can cause the vehicle to be unable to travel. The control unit 6 of the embodiment can control the resistance of the second switching device T32 to a resistance value that can ensure a state in which drive current enabling the vehicle to travel is passed through the motor 5. Thus, during traveling, the loss in the second switching device T32 can be increased by passing current also through the lower arm of the boost converter 3 while passing current through the upper arm of the boost converter 3.

Figure 7:
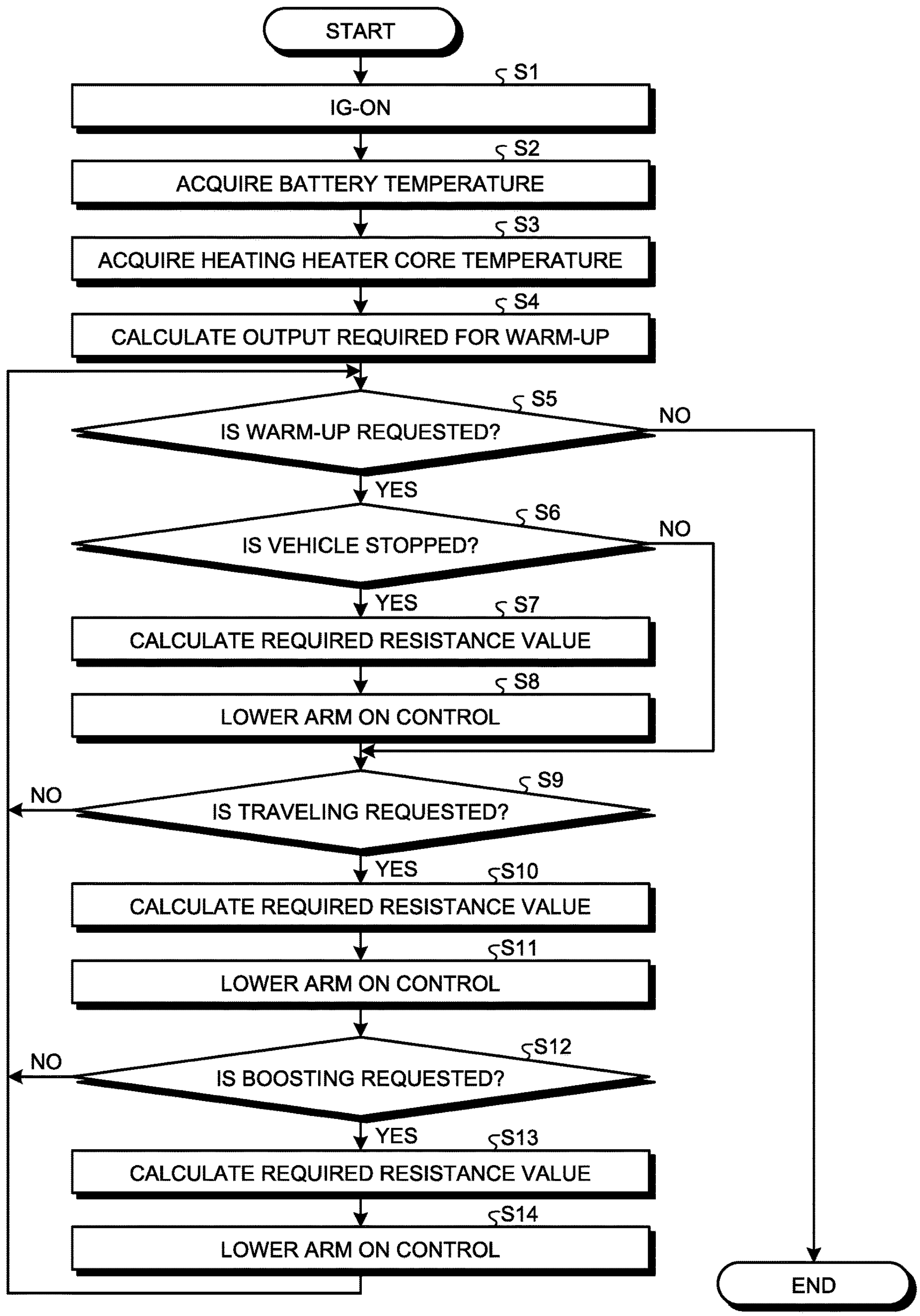
FIG. 7 is a flowchart illustrating an example of a warm-up control flow.

FIG. 7 is a flowchart illustrating an example of a warm-up control flow. The control flow illustrated in FIG. 7 is executed by the control unit 6.

The control unit 6 detects that the ignition switch of the vehicle has been turned on (IG-ON) (Step S1). The control unit 6 is configured to receive an ignition signal from the ignition switch.

The control unit 6 acquires the temperature of the battery 2 (Step S2), and acquires the temperature of the heater core for heating (Step S3). In Step S2, the battery temperature detected by the temperature sensor is input to the control unit 6. In Step S3, the heater core temperature detected by the temperature sensor is input to the control unit 6. Then, the control unit 6 calculates output required for warm-up (Step S4). In Step S4, output required for warm-up is calculated using the information acquired in Step S2 or S3.

For example, for warm-up requested for warming up the battery 2, the control unit 6 calculates output required for the warm-up in Step S4 based on the battery temperature acquired in Step S2. Alternatively, for warm-up requested for heating the vehicle interior, the control unit 6 calculates output required for the warm-up in Step S4 based on the heater core temperature acquired in Step S3. Thus, output required for warm-up is calculated in Step S4, depending on a device (component) to be warmed up.

Then, the control unit 6 determines whether warm-up is requested (Step S5). In Step S5, by detecting that an operating un (switch) that receives turning on a heating function has been operated, it can be determined that heating is requested. Alternatively, in Step S5, when the battery temperature acquired in Step S2 is lower than a threshold value, it can be determined that warm-up of the battery 2 is requested. Also, in Step S5, it can be determined which is requested, warm-up requested for warming up the battery 2 or warm-up requested (heating requested) for heating the vehicle interior, as warm-up requested.

If warm-up is not requested (Step S5: No), the control routine ends.

If warm-up is requested (Step S5: Yes), the control unit 6 determines whether the vehicle is stopped (Step S6). In Step S6, by determining whether the vehicle speed is zero, it can be determined whether the vehicle is stopped. The control unit 6 is configured to receive a vehicle speed from a vehicle speed sensor.

When the vehicle is not stopped with the warm-up requested (Step S6: No), the control routine proceeds to Step S9 described later.

When the vehicle is stopped with the warm-up requested. (Step S6: Yes), the control unit 6 calculates a resistance value required of the second switching device T32 of the lower arm for the warm-up requested in the warm-up control executed while the vehicle is stopped (first warm-up control) (Step S7). In Step S7, the resistance value of the second switching device T32 is calculated so as to bring about a state in which current flows only through the lower arm of the boost converter 3 as in the example illustrated in FIG. 2 described above. In this case, as illustrated in FIG. 4 described above, the control unit 6 sets the resistance value within the range in which the temperature of the second switching device T32 does not exceed the upper limit of the heat-resistance temperature. Further, the resistance value of the second switching device T32 is set to a resistance value larger than a resistance value during normal boosting operation by the processing in Step S7. Note that during normal boosting operation means during boosting operation performed without warm-up being requested.

Then, the control unit 6 executes the lower arm ON control of the boost converter 3 as the waste heat increase control for the warm-up requested while the vehicle is stopped, based on the resistance value calculated in Step S7 (Step S8). In Step S8, with the resistance value of the second switching device T32 of the boost converter 3 controlled to the resistance value calculated in Step S7, the lower arm ON control in the state in which the vehicle is stopped illustrated in FIG. 2 described above is executed. By the processing in Step S8, current flows only through the second switching device T32 of the lower arm of the boost converter 3.

Further, the control unit 6 determines whether traveling of the vehicle is requested with the warm-up requested (Step S9). In Step S9, the vehicle traveling request includes a case where it is detected that the accelerator pedal has been depressed, a case where it is detected that the side brake has been released, and a case where it is detected that the shift lever has been shifted from a non-traveling position (P range or N range) traveling position (D range). Signals input to the control unit 6 include a shift position from a shift position sensor that detects the operating position of the shift lever, an accelerator position from an accelerator pedal position sensor that detects the amount of depression of the accelerator pedal, and a brake pedal position from a brake pedal position sensor that detects the amount of depression of the brake pedal.

When traveling of the vehicle is not requested with the warm-up requested (Step S9: No), the control routine returns to Step S5.

When traveling of the vehicle is requested with the warm-up requested (Step S9: Yes), the control unit 6 calculates a resistance value required of the second switching device T32 of the lower arm for the warm-up requested in the warm-up control executed during traveling (second warm-up control) (Step S10). In Step S10, the resistance value of the second switching device T32 is calculated so as to bring about an energized state in which a small amount of current flows also through the lower arm of the boost converter 3 while ensuring an energized state in which drive current necessary for the vehicle to travel is passed through the motor 5, as in the example illustrated in FIG. 5 described above. The control unit 6 sets the resistance value within the range in which the temperature of the second switching device T32 does not exceed the upper limit of the heat-resistance temperature as illustrated in FIG. 4 described above, also when the vehicle is traveling, as when the vehicle is stopped. Further, the resistance value of the second switching device T32 is set to a resistance value larger than a resistance value during normal boosting operation by the processing in Step S10. In Step S10, the resistance value can be set to a value different from the resistance value set in Step S7 described above.

Then, the control unit 6 executes the lower arm ON control of the boost converter 3 as the waste heat increase control for the warm-up requested during traveling, based on the resistance value calculated in Step S10 (Step S11). In Step S11, the lower arm ON control in the traveling state illustrated in FIG. 5 described above is executed with the resistance value of the second switching device T32 of the boost converter 3 controlled to the resistance value calculated in Step S10. By the processing in Step S11, current flows not only through the first switching device T31 of the upper arm of the boost converter 3 but also through the second switching device T32 of the lower arm.

The control unit 6 determines whether voltage boosting is requested (Step S12). In Step S12, it is determined whether boosting is requested based on required power required of the vehicle, for example. The control unit 6 can calculate required power required of the vehicle based on the amount of depression of the accelerator pedal, the vehicle speed or the like.

If voltage boosting is not requested (Step S12: No), the control routine returns to Step S5.

When voltage boosting is requested (Step S12: Yes), the control unit 6 calculates a resistance value required of the second switching device T32 of the lower arm for the boosting requested and the warm-up requested, during the boosting operation of the boost converter 3 and in the warm-up control executed during traveling (second warm-up control) (Step S13). In Step S13, the resistance value of the second switching device T32 is calculated so as to bring about a state in which a small amount of current flows also through the lower arm of the boost converter 3 while ensuring a state in which drive current necessary for the vehicle to travel is passed through the motor 5, as in the example illustrated in FIG. 5 described above. The control unit 6 sets the resistance value within the range of resistant values in which the temperature of the second switching device T32 does not exceed the upper limit of the heat-resistance temperature as illustrated in FIG. 4 described above, also when the vehicle is traveling, as when the vehicle is stopped. Further, the resistance value of the second switching device T32 is set to a resistance value larger than a resistance value during normal boosting operation (during operation when warm-up is not requested) by the processing in Step S13. In Step S13, the resistance value can be set to a value different from the resistance values set in Steps S7 and S10 described above.

Then, the control unit 6 executes the lower arm ON control of the boost converter 3 as the waste heat increase control for the warm-up requested at the time of boosting operation and during traveling, based on the resistance value calculated in Step S13 (Step S14). In Step S14, the lower arm ON control in the traveling state illustrated in FIG. 5 described above is executed with the resistance value of the second switching device T32 of the boost converter 3 controlled to the resistance value calculated in Step S13, and at the time of boosting operation in the boost converter 3. When Step S14 is performed, the control routine returns to Step S5 described above.

As described above, according to the embodiment, warm-up of the vehicle can be performed using waste heat of the boost converter 3, regardless of whether the vehicle is stopped or traveling. In electric vehicles, warm-up using waste heat of an internal combustion engine is impossible. In this embodiment, however, the waste heat increase control using the lower arm of the boost converter 3 is executed, thus enabling warm-up even in electric vehicles without an electric heater for heat supplement being mounted. Consequently, an electric heater for heat supplement can be eliminated, and cost reduction and body size reduction become possible.

Further, according to the embodiment, waste heat generated the lower arm of the boost converter 3 can be increased without operating the inverter 4 and the motor 5. Thus, warm-up using waste heat of the boost converter 3 is possible while the vehicle is either stopped or traveling.

The thermal resistance of the second switching device T32 composed of an IGBT is smaller than the thermal resistance of the reactor L. Thus, compared to a hypothetical case where the heat of the reactor L is transferred to cooling water, the configuration of transferring the heat of the second switching device T32 to the cooling water as in the above-described embodiment is efficient. That is, according to the above-described embodiment, when heat is supplied to the device for which warm-up is requested, the heat of the heat generation unit can be efficiently recovered by the cooling water.

Although the above-described embodiment has described the case where the vehicle is an electric vehicle, the present disclosure is not limited to this. For example, the vehicle equipped with the system 1 may be a hybrid vehicle equipped with an engine as a power source.

According to the present disclosure, the second switching device constituting the lower arm of the boost converter can be used as a heat generation unit to generate heat for warm-up requested. This enables warm-up using waste heat of the boost converter regardless of whether the vehicle is traveling or stopped.

According to an embodiment, even when the first warm-up control is executed, no current flows through the first switching device of the upper arm, so that the second switching device of the lower arm can be used as a heat generation unit to perform warm-up while the vehicle is stopped.

According to an embodiment, it is possible to pass current through the second switching device of the lower arm for warm-up during traveling while ensuring a state in which current necessary for traveling is passed through the motor. Thus, the second switching device of the lower arm can be used as a heat generation unit to perform warm-up during traveling.

According to an embodiment, even when the vehicle shifts from the stopped state to the traveling state while warm-up is requested, it is possible to pass current through the second switching device of the lower arm for the warm-up while ensuring a state in which current necessary for traveling is passed through the motor. Thus, even when the vehicle shifts from the stopped state to the traveling state, the second switching device of the lower arm can be used as a heat generation unit to perform warm-up.

According to an embodiment, even when the vehicle is under very low temperature, for example, the second switching device of the lower arm can be used as a heat generation unit to warm up the electric storage device or a device for heating.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A vehicle warm-up control apparatus comprising:

a motor for travelling;

an inverter for driving the motor;

an electric storage device;

a boost converter connected to a low-voltage-side power line, to which the electric storage device is connected, and a high-voltage-side power line, to which the inverter is connected, the boost converter being capable of a boosting operation to boost power of the low-voltage-side power line and supply the power to the high-voltage-side power line; and a control unit for controlling the inverter and the boost converter, the boost converter comprising a first switching device as an upper arm connected to a positive electrode bus of the high-voltage-side power line, a second switching device as a lower arm connected to the first switching device and a negative electrode bus of the high-voltage-side power line, and a reactor connected to a connection point between the first switching device and the second switching device and a positive electrode bus of the low-voltage-side power line, wherein the second switching device is composed of a semiconductor device variable in resistance value, and when warm-up is requested, the control unit executes warm-up control to set the resistance value of the second switching device higher than the resistance value during operation when the warm-up is not requested, and supply heat generated in the second switching device by passing current through the second switching device to a device for which the warm-up is requested.

2. The vehicle warm-up control apparatus according to claim 1, wherein, when warm-up is requested while the vehicle stopped, the control unit executes first warm-up control to pass current through the second switching device to supply heat generated in the second switching device to a device for which the warm-up is requested, without passing current through the first switching device.

3. The vehicle warm-up control apparatus according to claim 2, wherein, when warm-up is requested during traveling, the control unit executes second warm-up control to pass current through the second switching device to supply heat generated in the second switching device to a device for which the warm-up is requested, while turning on the first switching device and passing drive current, that is current necessary for the vehicle to travel by power output from the motor, through the inverter and the motor.

4. The vehicle warm-up control apparatus according to claim 3, wherein, when shifting from the first warm-up control to the second warm-up control, the control unit sets the resistance value of the second switching device to a resistance value at which current can flow also through the second switching device, while securing the drive current necessary for the motor to power.

5. The vehicle warm-up control apparatus according to claim 1, wherein, when the warm-up is requested, at least one of a request for warming up the electric storage device and a request for heating a vehicle interior is included.

* * * * *